US010064302B2

(12) United States Patent
Friedlund et al.

(10) Patent No.: US 10,064,302 B2
(45) Date of Patent: Aug. 28, 2018

(54) POWER INVERTER WITH BALANCED POWER FLOW FOR MULTIPLE ELECTRICAL MACHINES

(71) Applicant: CATERPILLAR INC., Peoria, IL (US)

(72) Inventors: Jason Friedlund, Metamora, IL (US); Paul Thomas Schmidt, Washington, IL (US); Vincent Arguelles, Dunlap, IL (US); Saravanan Desigan, Perambalur, TN (US); Edo Duheric, Peoria, IL (US); Todd Nakanishi, Brimfield, IL (US)

(73) Assignee: Caterpillar Inc., Deerfield, IL (US)

( * ) Notice: Subject to any disclaimer, the term of this patent is extended or adjusted under 35 U.S.C. 154(b) by 0 days.

(21) Appl. No.: 15/408,173

(22) Filed: Jan. 17, 2017

(65) Prior Publication Data

US 2018/0206357 A1    Jul. 19, 2018

(51) Int. Cl.
| | | |
|---|---|---|
| *H02P 1/54* | (2006.01) |
| *H02P 5/00* | (2016.01) |
| *H02P 5/46* | (2006.01) |
| *H05K 7/02* | (2006.01) |
| *H02P 5/74* | (2006.01) |
| *H02M 7/00* | (2006.01) |
| *H05K 7/20* | (2006.01) |
| *H05K 13/00* | (2006.01) |
| *H02M 1/00* | (2006.01) |

(52) U.S. Cl.
CPC ............ *H05K 7/026* (2013.01); *H02M 7/003* (2013.01); *H02P 5/74* (2013.01); *H05K 7/2039* (2013.01); *H05K 13/0023* (2013.01); *H02M 2001/008* (2013.01)

(58) Field of Classification Search
CPC .......... H02P 5/68; A63H 19/24; B64C 13/24; Y02T 10/646; B23C 3/16
USPC .......................................................... 318/51
See application file for complete search history.

(56) References Cited

U.S. PATENT DOCUMENTS

| | | |
|---|---|---|
| 6,586,674 B2 | 7/2003 | Krause et al. |
| 6,799,993 B2 | 10/2004 | Krieger et al. |
| (Continued) | | |

FOREIGN PATENT DOCUMENTS

| | | |
|---|---|---|
| CN | 101269661 | 9/2008 |
| CN | 201312254 | 9/2009 |
| (Continued) | | |

*Primary Examiner* — Kawing Chan
*Assistant Examiner* — Bradley Brown
(74) *Attorney, Agent, or Firm* — Finnegan, Henderson, Farabow, Garrett & Dunner, LLP; James S. Bennin (57) ABSTRACT

A power inverter assembly provides a balanced power flow to each of a plurality of electrical machines. The power inverter assembly includes at least one heat sink having a top side and a bottom side, a plurality of pairs of power semiconductor modules mounted along the top and bottom sides of a heat sink for thermal exchange with the heat sink, and a plurality of gate driver boards configured to control the supply of DC power to each of the plurality of pairs of power semiconductor modules. A first pair of semiconductor modules is symmetrically arranged relative to second and third pairs such that the arrangement of the first, second, and third pairs of power semiconductor modules forms a geometric pattern with at least one of the second and third pairs at least partially overhanging the first pair.

18 Claims, 5 Drawing Sheets

(56) References Cited

U.S. PATENT DOCUMENTS

| | | |
|---|---|---|
| 9,042,112 B2 | 5/2015 | Guar et al. |
| 9,277,660 B1 | 3/2016 | McBroom et al. |
| 2003/0112587 A1 | 6/2003 | Krause et al. |
| 2007/0008707 A1* | 1/2007 | Coutu ................ H05K 7/20418 361/800 |
| 2007/0076355 A1* | 4/2007 | Oohama ............... H01L 25/117 361/676 |
| 2009/0219696 A1 | 9/2009 | Nakayama et al. |
| 2013/0010428 A1* | 1/2013 | Hayashi ............. H01L 23/4093 361/704 |
| 2014/0230877 A1 | 8/2014 | Goldberg et al. |
| 2014/0306791 A1 | 10/2014 | Kanazawa et al. |

FOREIGN PATENT DOCUMENTS

| | | |
|---|---|---|
| CN | 202856597 | 4/2013 |
| CN | 203205577 | 9/2013 |
| CN | 203206130 | 9/2013 |
| CN | 204231210 | 3/2015 |
| CN | 104796009 | 7/2015 |
| CN | 204442889 | 7/2015 |
| EP | 1445853 | 11/2004 |
| JP | 201238751 | 2/2012 |
| KR | 20120017545 | 2/2012 |

\* cited by examiner

POWER INVERTER WITH BALANCED POWER FLOW FOR MULTIPLE ELECTRICAL MACHINES

TECHNICAL FIELD

The present disclosure relates to a power inverter, and more particularly, a power inverter with balanced power flow for multiple electrical machines.

BACKGROUND

Power converters are commonly used to convert alternating current (AC) power from a generator to direct current (DC) power, and from DC power to AC power for use by a motor. Power conversion requires switching of large currents by power semiconductor devices, such as insulated gate bipolar transistors (IGBTs). An electric drive traction application typically includes both AC/DC conversion to receive power from a generator and DC/AC conversion to power a motor. The generator is typically driven by an engine.

The IGBT power modules are the heart of the inverter for converting DC power to AC power. The IGBT modules are densely packaged with the rest of the inverter components. The IGBT modules dictate the shape and position of the AC and DC bus bars, the configuration of the gate driver boards, and the configuration of one or more heat sinks provided to dissipate heat generated as electric current flows through the IGBT devices included in each IGBT power module. Switching to a different power module typically requires redesigning the adjoining components.

Most electric drivetrains for machines use induction motor/generator technology or permanent magnet (PM) motor/generator technology. In either case, the power inverter architecture is the same and uses power modules optimized for this application. Such power modules have insulated gate bipolar transistors (IGBTs) and diodes packaged in a configuration that supports induction/PM applications. The power modules for induction/PM applications are configured to receive or provide power in multiple phase configurations, such as a three phase (X, Y, Z) configuration.

However, many drivetrain applications are moving to switched reluctance (SR) motor technology, which offers a simpler rotor design at the expense of more complex motor controls. SR technology also uses IGBTs and diodes, but requires a power module with a different configuration than induction/PM technology. The power modules for SR applications are not limited to a three phase output. The number of outputs is determined by the number of stator poles and rotor poles and therefore may have more than three outputs.

Different power inverter applications may also have different requirements for locations of external connections and configurations of a protective enclosure in which the IGBT modules are contained. In applications requiring power inverters for multiple electrical machines, such as multiple AC electric motors, additional pairs of IGBT devices or other power semiconductors for each additional electrical machine are often added in a linear arrangement to a long heat sink, resulting in a power inverter enclosure that may be exceedingly long in one dimension. As the number of pairs of power modules increases, the power modules are connected in parallel, and the amount of current flowing through the power modules increases for high power applications such as portable power generating plants, and large mining and other earth moving machines, it becomes important to balance the amount of electrical power carried by each module. A well balanced power inverter assembly will have better performance and durability than an inverter assembly where some of the power modules carry different amounts of electrical power than others.

European Patent Application No. EP 1 445 853 to Still et al., published August 11, 200, entitled "Converter Module" ("the '853 publication"), discloses a converter module including a heat sink and a semiconductor phase mounted on the heat sink. A pair of semiconductor modules include an AC bus bar connected to the emitter of one semiconductor module and the collector of the other semiconductor module, and a pair of DC bus bars connected respectively to the remaining collector and emitter terminals of the pair of semiconductor modules.

The disclosed system and methods are directed to overcoming one or more problems set forth above.

SUMMARY

In one aspect, the present disclosure is directed to a power inverter assembly configured to provide a balanced power flow to each of a plurality of electrical machines. The power inverter assembly includes at least one heat sink having a top side and a bottom side, a plurality of pairs of power semiconductor modules mounted along the top and bottom sides of at least one of the at least one heat sink for thermal exchange with the at least one heat sink, and a plurality of gate driver boards configured to control a supply of DC power to each of the plurality of pairs of power semiconductor modules. Each pair of power semiconductor modules is configured to switch DC electrical power on and off to one phase of one of a three phase AC electrical motor or a three phase AC electrical generator of the plurality of electrical machines. A first pair of the plurality of pairs of power semiconductor modules is configured to supply electrical power to a first phase of a first one of a three phase AC electrical motor or generator, the first pair being located on and connected to one of a top side or a bottom side of one of the at least one heat sink for thermal exchange therewith. Second and third pairs of the plurality of pairs of power semiconductor modules are configured to supply electrical power to second and third phases, respectively, of the first three phase AC electrical motor or generator, the second and third pairs being located on and connected to the other of a top side or a bottom side of one of the at least one heat sink for thermal exchange therewith. The first pair is symmetrically arranged relative to the second and third pairs such that the arrangement of the first, second, and third pairs of power semiconductor modules forms a geometric pattern with at least one of the second and third pairs at least partially overhanging the first pair.

In another aspect, the present disclosure is directed to a power inverter assembly configured to provide a balanced power flow to each of a plurality of electrical machines. The power inverter assembly includes at least one heat sink having a top side and a bottom side, a plurality of pairs of power semiconductor modules mounted along the top and bottom sides of at least one of the at least one heat sink for thermal exchange with the at least one heat sink, and a plurality of gate driver boards configured to control a supply of DC power to each of the plurality of pairs of power semiconductor modules. Each pair of power semiconductor modules is configured to switch DC electrical power on and off to one phase of one of a three phase AC electrical motor or a three phase AC electrical generator of the plurality of electrical machines. A first pair of the plurality of pairs of power semiconductor modules is configured to supply electrical power to a first phase of a first one of a three phase AC electrical motor or generator, the first pair being located on and connected to one of a top side or a bottom side of one of the at least one heat sink for thermal exchange therewith. Second and third pairs of the plurality of pairs of power semiconductor modules are configured to supply electrical power to second and third phases, respectively, of the first three phase AC electrical motor or generator, the second and third pairs being located on and connected to the other of a top side or a bottom side of one of the at least one heat sink for thermal exchange therewith. The first pair is asymmetrically arranged relative to the second and third pairs such that the arrangement of the first, second, and third pairs of power semiconductor modules forms a geometric pattern with at least one of the second and third pairs at least partially overhanging the first pair.

In yet another aspect, the present disclosure is directed to a method of manufacturing a protective enclosure for housing a power inverter assembly. The method includes forming each of four independent walls for the protective enclosure, wherein each of the four walls includes at least one of structural features and mounting features. The structural features assist in the alignment, positioning and joining of the four independent walls together into the protective enclosure. The mounting features at least one of support and position at least one of a heat sink, a circuit board, and an electronic component. The method further includes bonding the four independent walls together using a structural adhesive.

DETAILED DESCRIPTION

Figure 1:
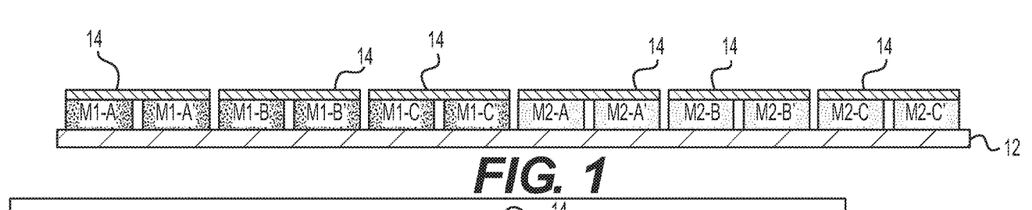
FIG. 1 is schematic diagram of a power inverter assembly with a linear arrangement of power semiconductors mounted on one side of a heat sink.

FIGS. 1-4 illustrate several different embodiments of power inverter assemblies configured for providing AC electrical power to multiple electrical machines, with pairs of power semiconductors mounted along one or more heat sinks, and with each of the pairs of power semiconductors interconnected by individual driver boards. The power semiconductors can be insulated gate bipolar transistors (IGBTs), metal-oxide semiconductor field-effect transistors (MOSFETs), or other transistors used for switching or amplifying electronic signals. FIG. 1 illustrates an approach for arranging and mounting power semiconductors relative to a heat-sink in a power inverter package. The exemplary embodiment of FIG. 1 includes pairs of power semiconductors configured for controlling the supply of AC power to the three phases of two three phase AC electrical motors, with the pairs of power semiconductors arranged linearly along a single long heat sink 12, and each pair of power semiconductors being interconnected by a driver board 14. M1-A, M1-A' are a pair of IGBTs in a pair of IGBT modules connected to a first phase A of a first motor M1; M1-B, M1-B' are a pair of IGBTs connected to a second phase B of the first motor M1; and M1-C, M1-C' are a pair of IGBTs connected to a third phase C of the first motor M1. M2-A, M2-A' are a pair of IGBTs connected to a first phase A of a second motor M2; M2-B, M2-B' are a pair of IGBTs connected to a second phase B of the second motor M2; and M2-C, M2-C' are a pair of IGBTs connected to a third phase C of the second motor M2. The linear approach to mounting power semiconductors to the heat sink 12 in the embodiment of FIG. 1 results in a power inverter package that becomes long in one dimension, and may not provide the best package configuration for some applications.

Figure 2:
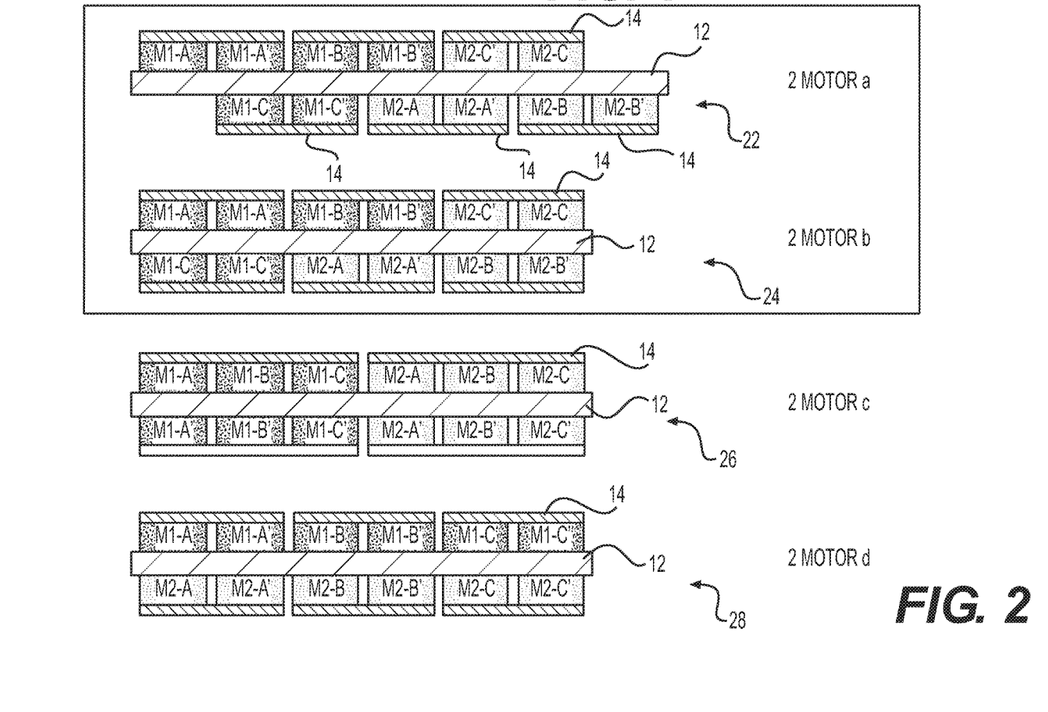
FIG. 2 provides four schematic diagrams of four different arrangements of power semiconductor modules in exemplary power inverter assemblies according to this disclosure for use in an application supplying AC power to two three phase AC electric motors.
Figure 3:
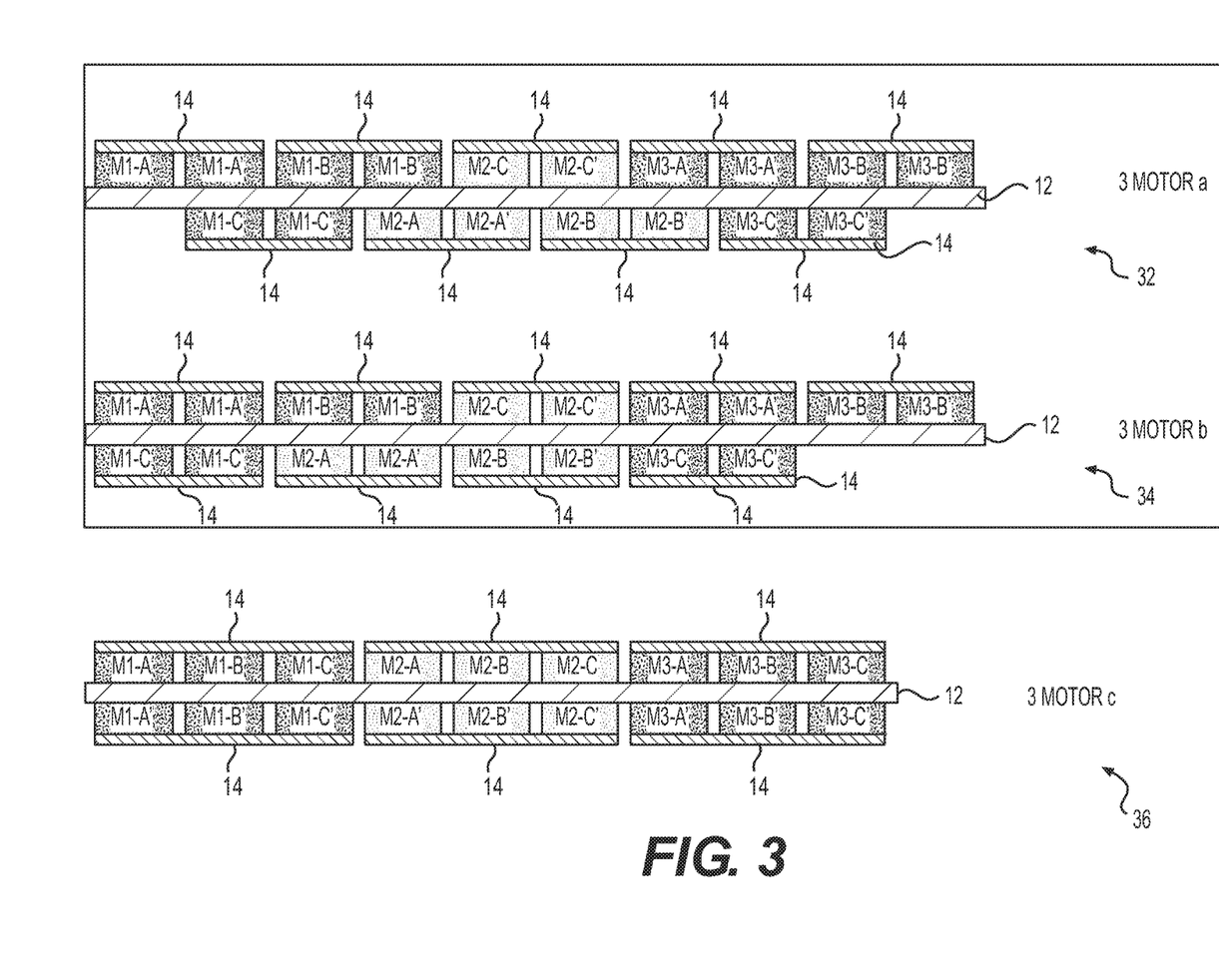
FIG. 3 provides three schematic diagrams of three different arrangements of power semiconductor modules in exemplary power inverter assemblies according to this disclosure for use in an application supplying AC power to three phase AC electric motors.
Figure 4:
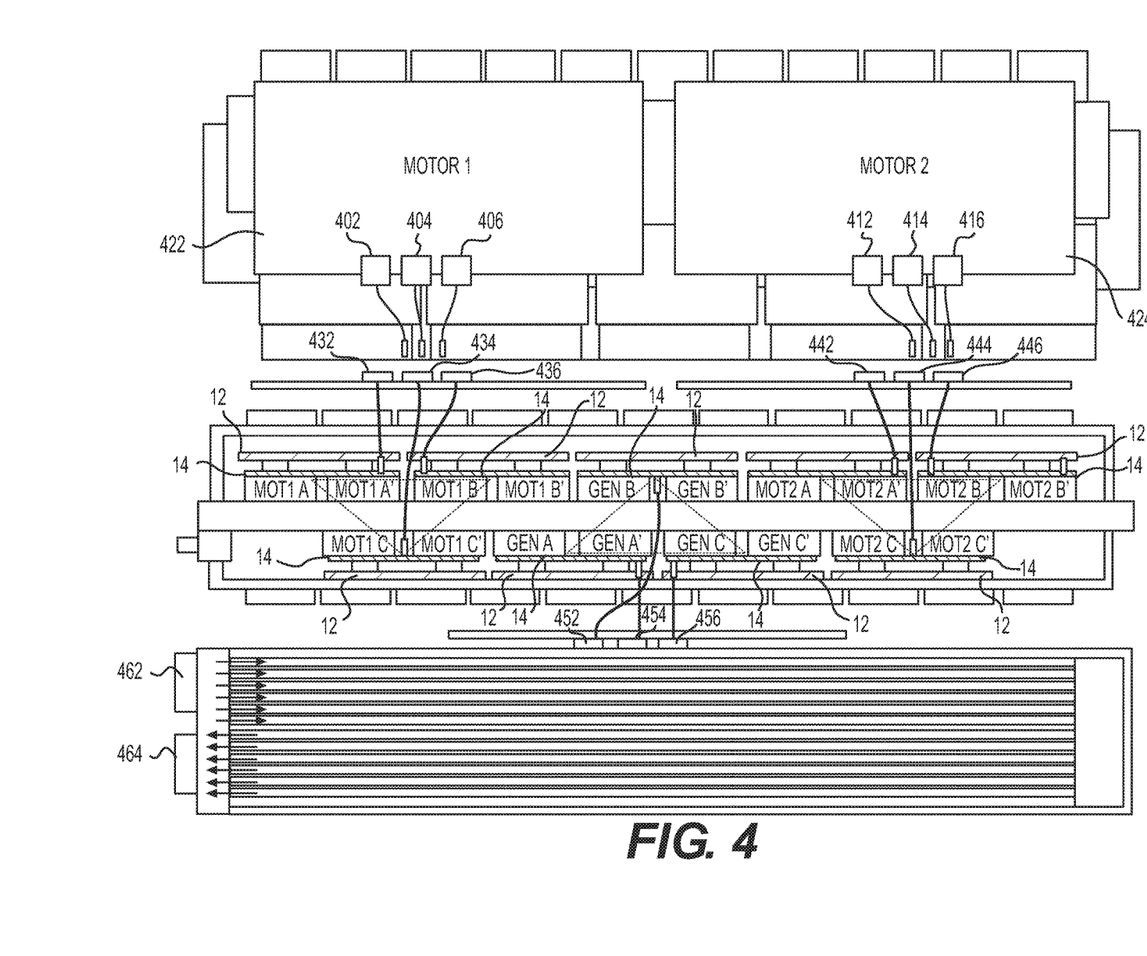
FIG. 4 is a schematic diagram of an exemplary power inverter assembly providing AC power to two three phase AC electric motors and to a main AC power source.

The alternative arrangements of power semiconductors in the embodiments of the power inverter packages illustrated in FIGS. 2-4 provide power inverter designs that improve power flow through the inverter assemblies by minimizing the distance between power stage phases for each electrical machine and placing a main power source centrally in the design. The alternatives and variations shown in FIGS. 2-4 provide a more compact electrical arrangement than in the embodiment of FIG. 1, and as a result may also minimize parasitic bus bar inductance in the electrical interconnections between the IGBTs. The parallel arrangements of power semiconductors in the inverter packages of FIGS. 2-4 also reduce the required volume for an inverter assembly package, reduce the length of heat sinks used for dissipation of heat generated during the operation of the power inverter assemblies, and reduce temperature gradients even when the power semiconductors are connected in parallel to accommodate higher power applications. Although the exemplary embodiments discussed below switch DC power on and off to three phases of either a three phase AC electrical motor or a three phase AC generator, one of ordinary skill in the art will recognize that SR motors may have more than three phases, and therefore the arrangements of power semiconductors and the number of pairs of power semiconductor modules may be different from those shown and discussed below.

FIG. 2 illustrates 4 different exemplary power inverter assemblies for a two motor application, such as an electric drive for an earth moving machine such as a wheel loader or a bulldozer. The arrangement of power semiconductors in the power inverter assembly 22 for "2 MOTOR a" includes three pairs of IGBT modules for driving each of three phases of two electric, three-phase motors M1 and M2. Each of the pairs of IGBTs is located with both IGBT modules of the pair on the same side of a centrally located heat sink 12. The IGBTs in each pair of IGBT modules on each side of the centrally located heat sink 12 are also connected to a common driver board 14, which controls the switching on and off of the individual IGBT modules. In the embodiments illustrated in FIG. 2, a heat sink 12 is located on and connected to one side of the pairs of IGBT modules for thermal exchange therewith. Each heat sink 12 is configured for dissipation of thermal energy generated during operation of the IGBT modules. In the exemplary embodiments illustrated in FIG. 2, one or more driver boards 14 are connected to an opposite side of the pairs of IGBT modules.

The input and output power semiconductor switches of the power inverter assemblies, such as the IGBTs, may be mounted on a flexible thermal system assembly including the heatsink 12 for easy configuration and flexibility. The heat sink 12 may be an aluminum block with channels defined therethrough for the passage of a coolant such as glycol or water. When modifications to the power semiconductor switches (IGBTs) of the IGBT modules are required, they can be accomplished by simply replacing the power semiconductor switches mounted on the heat sink 12. Additional pairs of IGBT modules may also be added for additional phases of multi-phase AC electric motors driven by the power inverter assemblies. The same IGBT module or equivalent power semiconductor switch may be used in a core power conversion module for multiple applications or topologies simply by altering application specific sub-panels, re-programming of control software, and installing the proper hardware logic module on driver boards 14. The modular design of the power inverter assemblies provides a flexible design such that new software or optional assemblies is all that is needed to handle new applications. For example, the driver boards 14 are designed such that they can be easily replaced with different driver boards tailored to a specific application. The driver boards 14 and transistor gate drives mounted thereon can be easily replaced with alternative gate driver boards having different properties. Thus, dividing the power inverter assemblies into a series of interconnected driver boards mounted on opposite sides of a common heat sink allows the power inverter assemblies to be readily adapted for individual applications simply by reconfiguring only those driver boards that are required for the application.

The power inverter assembly 22 for "2 MOTOR a" locates the pairs of IGBT modules for controlling each of the three phases of the two electric motors on both sides of a common heat sink 12. Pairs M1-A, M1-A' and M1-B, M1-B' for controlling phases A and B of motor M1 are located on and connected to the top side of the heat sink 12 for thermal exchange therewith, while pair M1-C, M1-C' for controlling phase C of motor M1 is located on and connected to the bottom side of the heat sink 12 for thermal exchange therewith. The pair of IGBT modules for controlling phase C of motor M1 is symmetrically arranged on the opposite side of the heat sink 12 and immediately below the 2 pairs of IGBT modules for controlling phases A and B of motor M1. This symmetrical arrangement of the IGBT modules for M1 forms a geometric pattern with at least one of the pairs of IGBT modules for controlling phases A and B of motor M1 at least partially overhanging the pair of IGBT modules for controlling phase C of motor M1. In the illustrated exemplary embodiment for power inverter assembly 22 for "2 MOTOR a", IGBT module M1-A on the top side of heat sink 12 overhangs the pair of IGBT modules M1-C, M1-C' on the bottom side of heat sink 12, and IGBT module M1-B' on the top side of heat sink 12 overhangs the pair of IGBT modules M1-C, M1-C' on the bottom side of heart sink 12. An IGBT module "overhangs" a pair of IGBT modules that are on one side or the other of the overhanging module when the overhanging module protrudes past an end of the pair of modules. This overhang allows an adjacent power inverter assembly with a similarly arranged but inversely oriented group of IGBT modules to at least partially overlap with the power inverter assembly for a more compact arrangement of power inverter assemblies than could be attained with multiple power inverter assemblies lacking the overhanging feature. As a result, the pairs of IGBT modules for motor M1 of power inverter assembly 22 form a symmetrical geometric pattern that is approximately an isosceles triangle-shaped configuration with the apex of the triangle below the heat sink 12, and the base of the triangle above the heat sink 12.

Similarly, but in an adjacent and mirror image arrangement to the arrangement for the first motor M1, pairs of IGBT modules M2-A, M2-A' and M2-B, M2-B' for controlling phases A and B of a second motor M2 are located on the bottom side of the same heat sink 12, while the pair of IGBT modules M2-C, M2-C' for controlling phase C of the second motor M2 is located on the top side of the heat sink 12. The pair of IGBT modules for controlling phase C of motor M2 is symmetrically arranged on the opposite side of the heat sink 12 and immediately above the 2 pairs of IGBT modules for controlling phases A and B of motor M2 such that the IGBT modules for motor M2 are arranged to form a geometric pattern with at least one of the pairs of IGBT modules for controlling phases A and B of motor M2 at least partially overhanging the pair of IGBT modules for controlling phase C of motor M2. In the illustrated exemplary embodiment for power inverter assembly 22 for "2 MOTOR a", IGBT module M2-A on the bottom side of heat sink 12 overhangs the pair of IGBT modules M2-C, M2-C' on the top side of heat sink 12, and IGBT module M2-B' on the bottom side of heat sink 12 overhangs the pair of IGBT modules M2-C, M2-C' on the top side of heart sink 12. As a result, the pairs of IGBT modules for motor M2 of power inverter assembly 22 form a symmetrical geometric pattern that is approximately an isosceles triangle-shaped configuration with the apex of the triangle above the heat sink 12. The triangular configuration of the IGBT modules for motor M2 is oriented inversely to the triangular configuration of IGBT modules for motor M1, with the apex of the triangular arrangement of power semiconductors for motor M2 being located above the heat sink 12. This arrangement allows the IGBT modules for both motors M1 and M2 to be placed closely together in a partially overlapping relationship. The mounting arrangement for the IGBT modules on opposite sides of the heat sink 12 results in good power flow within the power inverter assembly, brings the power phases physically closer together, and provides a compact arrangement of the IGBT modules with improved thermal dissipation and more balanced power flow as compared to the linear arrangement of power semiconductors illustrated in FIG. 1.

Figure 5:
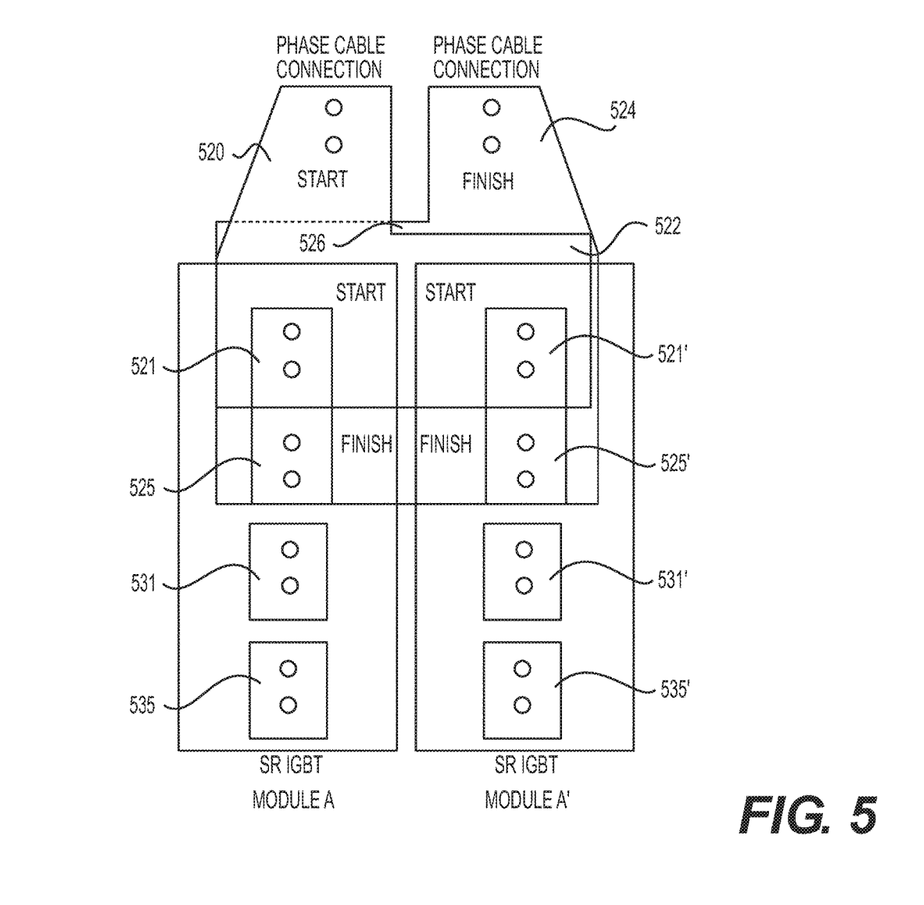
FIG. 5 is a schematic diagram of a pair of broad flat plate connectors according to an exemplary embodiment of the present disclosure, connecting the AC output sides of a pair of IGBT modules in parallel to common connection points.

FIG. 5 illustrates an alternating current (AC) laminated bus bar structure 520, 524 that may be used for connecting two or more IGBT modules for a switch reluctance (SR) motor in parallel and to a common connection point (typically referred to as "START" or "FINISH"). The illustrated structure of the AC laminated bus bar 520, 524 is provided in the same region as the driver boards 14 illustrated in FIGS. 2-4. The pairs of IGBTs 521, 521', and 525, 525', are on the AC output side of the pair of SR IGBT modules A, A'; and the pairs of IGBTs 531, 531', and 535, 535' are on the DC input side of the pair of SR IGBT modules A, A'. The pair of SR IGBT modules A, A' in FIG. 5 correspond to the pairs of IGBT modules shown on the top and bottom of the heat sink 12 for each phase of each motor in FIGS. 2-4. The laminated bus bar 520 includes a protruding large flat plate portion 522 overlaying the outputs of the pair of IGBTs 521, 521' connected to the common connection point START, while the laminated bus bar 524 includes a protruding large flat plate portion 526 overlaying the outputs of the pair of IGBTs 525, 525' connected to the common connection point FINISH. In an embodiment according to this disclosure, the laminated bus bar structure couples the output side of each pair of IGBT modules in parallel, and allows each pair of IGBT modules to share matching power outputs more effectively, with improved thermal dissipation over the larger radiating surface area of the broad flat plate conductors, and with a lower inductance path than a fabricated bus bar structure or wired interconnection. The large flat plate conductors may be formed from pure copper sheets for good electrical conductivity, and at least partially coated with a polyester film, or other plastic materials for insulation. The broad flat conducting paths between each of the pairs of IGBT modules interconnected by the laminated bus bar structure results in a low inductance path with well-balanced electrical power sharing, a low moment of inertia for the inverter assembly (important in high vibration applications) and closely matched electrical impedances.

The alternative power inverter assembly 24 for "2 MOTOR b" also locates the pairs of IGBT modules for controlling each of the three phases of the two electric motors on both sides of the heat sink 12. Pairs of IGBT modules M1-A, M1-A' and M1-B, M1-B' for controlling phases A and B of motor M1 are located on the top side of the heat sink 12, while the pair of IGBT modules M1-C, M1-C' for controlling phase C of motor M1 is located on the bottom side of the heat sink 12. In the configuration of the alternative power inverter assembly 24, the pair of IGBT modules for controlling phase C of motor M1 is arranged on the opposite side of the heat sink and immediately below the pair of IGBT modules M1-A, M1-A' for controlling phase A of motor M1. The IGBT modules for M1 are arranged to form an asymmetric geometric pattern with at least one of the pairs of IGBT modules for controlling phases A and B of motor M1 at least partially overhanging the pair of IGBT modules for controlling phase C of motor M1. In the illustrated exemplary embodiment for power inverter assembly 24, the pairs of IGBT modules form a geometric pattern with a L-shaped configuration having the long leg of the L for motor M1 located on the top side of the heat sink 12. Similarly, pairs of IGBT modules M2-A, M2-A' and M2-B, M2-B' for controlling phases A and B of motor M2 are located on the bottom side of the same heat sink 12, while the pair of IGBT modules M2-C, M2-C' for controlling phase C of motor M2 is located on the top side of the heat sink 12. The pair of IGBT modules for controlling phase C of motor M2 is arranged on the opposite side of the heat sink 12 and immediately above the pair of IGBT modules M2-B, M2-B' for controlling phase B of motor M2. As a result, the IGBT modules for motor M2 are arranged in a L-shaped configuration that is oriented inversely to the L-shaped configuration of IGBT modules for motor M1, with the long leg of the L for motor M2 located on the bottom side of the heat sink 12. The arrangement for the power inverter assembly 24 also allows for a partial overlap of the pairs of IGBT modules for controlling the phases of each of the two motors M1, M2, thereby minimizing the distance between power stage phases. This arrangement results in good power flow within the power inverter assembly, and provides a compact arrangement of the IGBT modules with improved thermal dissipation, more balanced power flow, and a lower moment of inertia in comparison to the linear arrangement of power semiconductors illustrated in FIG. 1.

Another power inverter assembly 26 for "2 MOTOR c" shown in FIG. 2 takes another alternative approach of splitting each of the pairs of IGBT modules for controlling each of the three phases of the two electric motors on opposite sides of the heat sink 12. The IGBT module M1-A of the pair of IGBT modules for controlling phase A of motor M1 is located on the top side of the heat sink 12, while the other IGBT module M1-A' for controlling phase A of motor M1 is located on the bottom side of the heat sink 12. Similarly, one IGBT module for each of the pairs of modules for controlling each phase of each motor is located on the top side of the heat sink 12, while the other IGBT module for each of the pairs of modules for controlling each phase of each motor is located on the bottom side of the heat sink 12. IGBT modules M1-A, M1-B, M1-C, M2-A, M2-B, and M2-C are all located on the top side of the heat sink 12, while IGBT modules M1-A', M1-B', M1-C', M2-A', M2-B', and M2-C' are all located on the bottom side of the heat sink 12. In the power inverter assembly 26 a single driver board 14 may be provided to connect all of the IGBT modules for a motor that are located on the same side of the heat sink 12. For example, all IGBT modules M1-A, M1-B, and M1-C located on the top side of the heat sink 12 are connected together by one driver board 14. Similarly, all IGBT modules M2-A, M2-B, and M2-C located on the top side of the heat sink 12 are connected together by one driver board 14.

Yet another power inverter assembly 28 for "2 MOTOR d" provides still another alternative approach for dividing pairs of IGBT modules for driving the three phases of motors M1, M2, and M3 above and below the heat sink 12. In the power inverter assembly 28, all three pairs of IGBT modules for driving the three phases of AC electric motor M1 are located on the top side of the heat sink 12, while all three pairs of IGBT modules for driving the three phases of AC electric motor M2 are located on the bottom side of the heat sink 12. In the power inverter assembly 28, three separate driver boards 14 connect each of the pairs of IGBT modules for driving the three phases of motor M1 on the top side of the heat sink 12, while three separate driver boards 14 connect each of the pairs of IGBT modules for driving the three phases of motor M2 on the bottom side of the heat sink 12.

FIG. 3 illustrates three more alternative power inverter assemblies for driving the three phases of each of three AC electric motors, M1, M2, and M3, such as may be used in high power applications for large off-road vehicles, mining equipment, and high power generating plants. The power inverter assembly 32 for "3 MOTOR a" uses a similar triangular arrangement of IGBT modules for each AC electric motor as discussed above with regard to power inverter assembly 22 for "2 MOTOR a". The power inverter assembly 34 for "3 MOTOR b" uses a similar L-shaped arrangement of IGBT modules for each AC electric motor as discussed above with regard to power inverter assembly 24 for "2 MOTOR b". The power inverter assembly 36 for "3 MOTOR c" uses a split arrangement of IGBT modules similar to the arrangement for power inverter assembly 26 for "2 MOTOR c", with each of the pairs of IGBT modules for driving each of the phases of the three AC electric motors M1, M2, and M3 being split with one IGBT module located on the top side of the heat sink 12 and the other IGBT module of each pair of modules located on the bottom side of the heat sink 12 opposite from each other.

As shown in FIG. 3, the power inverter assembly 32 for "3 MOTOR a" locates the pairs of IGBT modules for controlling each of the three phases of the three AC electric motors M1, M2, M3 on both sides of the heat sink 12. Pairs M1-A, M1-A' and M1-B, M1-B' for controlling phases A and B of motor M1 are located on the top side of the heat sink 12, while pair M1-C, M1-C' for controlling phase C of motor M1 is located on the bottom side of the heat sink 12. The pair of IGBT modules for controlling phase C of motor M1 is symmetrically arranged on the opposite side of the heat sink 12 and immediately below the two pairs of IGBT modules for controlling phases A and B of motor M1 such that the IGBT modules for M1 are arranged to form a geometric pattern with at least one of the pairs of IGBT modules for controlling phases A and B of motor M1 at least partially overhanging the pair of IGBT modules for controlling phase C of motor M1. In the exemplary embodiment for power inverter assembly 32, the pairs of IGBT modules for controlling the phases of motor M1 form a substantially triangular configuration with the apex of the triangle located below the heat sink 12.

Similarly, but in an adjacent and mirror image arrangement to the arrangement for motor M1, pairs of IGBT modules M2-A, M2-A' and M2-B, M2-B' for controlling phases A and B of motor M2 are located on the bottom side of the same heat sink 12, while the pair of IGBT modules M2-C, M2-C' for controlling phase C of motor M2 is located on the top side of heat sink 12. The pair of IGBT modules for controlling phase C of motor M2 is symmetrically arranged on the opposite side of the heat sink 12 and immediately above the two pairs of IGBT modules for controlling phases A and B of motor M2 such that the IGBT modules for motor M2 are arranged in a triangular configuration that is the inverse of the triangular configuration of IGBT modules for motor M1, with the apex of the triangle for motor M2 being located above the heat sink 12.

In another adjacent and mirror image arrangement to the arrangement for motor M2, pairs of IGBT modules M3-A, M3-A' and M3-B, M3-B' for controlling phases A and B of motor M3 are located on the top side of the same heat sink 12, while the pair of IGBT modules M3-C, M3-C' for controlling phase C of motor M3 is located on the bottom side of heat sink 12. The pair of IGBT modules for controlling phase C of motor M3 is symmetrically arranged on the opposite side of the heat sink 12 and immediately below the two pairs of IGBT modules for controlling phases A and B of motor M3 such that the IGBT modules for motor M3 are arranged in a triangular configuration that is the inverse of the triangular configuration of IGBT modules for motor M2, with the apex of the triangle for motor M3 being located below the heat sink 12. The above-described arrangements of IGBT modules for power inverter assembly 32 allow the IGBT modules for all three AC electric motors M1, M2, and M3 to be placed closely together in a partially overlapping relationship. The mounting arrangement for the IGBT modules on opposite sides of the heat sink 12 results in good power flow within the power inverter assembly, and provides a compact arrangement of the IGBT modules with improved thermal dissipation and more balanced power flow as compared to the linear arrangement of power semiconductors illustrated in FIG. 1. The arrangements of power semiconductors in the alternative power inverter assemblies 34 and 36 illustrated in FIG. 3 also provide more compact arrangements of the IGBT modules on opposite sides of the heat sink 12, with improved thermal dissipation and more balanced power flow than the linear arrangement of power semiconductors illustrated in FIG. 1.

The triangular configuration of power semiconductors for the power inverter assembly 32 ("3 MOTOR a") shown in FIG. 3 is similarly used in a SR power inverter assembly configured to supply AC power to a main power source through positive and negative power buses 462, 464, and to two AC motors 422, 424, shown in FIG. 4. The triangular configuration of the IGBT modules enables placement of the main power source centrally in the power inverter assembly design, and minimizes the distance between power stage phases. As illustrated in FIG. 4, the centrally located main power source is a 3 phase AC generator including three pairs of power semiconductors: GEN A, GEN A' for phase A, GEN B, GEN B' for phase B, and GEN C, GEN C' for phase C. In the power inverter assembly of FIG. 4 each of the pairs of power semiconductors is connected to a separate driver board 14, and heat from each driver board is dissipated through a separate heat sink 12.

The centrally located main power source in FIG. 4 supplies power from phase B of the converted AC power through a terminal at the driver board connected to the pair of power semiconductors GEN B, GEN B', which are located at the apex of the centrally located triangular arrangement of IGBTs. The phase B power is supplied to a terminal 452 on the main power source. Phase A power is supplied from the driver board 14 connected to the pair of power semiconductors GEN A, GEN A' to terminal 454, and phase C power is supplied from the driver board 14 connected to the pair of power semiconductors GEN C, GEN C' to terminal 456. The power inverter arrangement of FIG. 4 also supplies three phase AC power from the partially overlapping triangular arrangements of pairs of power semiconductors that supply the three phase AC power to the three terminals 402, 404, 406 of AC motor 422 (MOTOR 1), and to the three terminals 412, 414, 416 of AC motor 424 (MOTOR 2). For MOTOR 1, phase C power is supplied from the pair of power semiconductors MOT1 C, MOT1 C' located at the apex of the triangular arrangement to a connecting pad 434. Phase A power is supplied from the pair MOT1 A, MOT1 A' to a connecting pad 432, and phase B power is supplied from the pair MOT1 B, MOT1 B' to a connecting pad 436. The connecting pads 432, 434, 436 are connected to the three phase terminals 402, 404, 406 on MOTOR 1.

On the opposite side of the centrally located main power source in FIG. 4, the pairs of power semiconductors for supplying phase power to MOTOR 2 are arranged in the reverse of the adjacent triangular arrangement of power semiconductors for the main power source, thereby allowing the semiconductors to partially overlap in a compact arrangement. Phase C power is supplied from the pair of power semiconductors MOT2 C, MOT2 C' at the apex of the triangular arrangement to connecting pad 444, which is connected to phase terminal 414 of MOTOR 2. The pairs of power semiconductors MOT2 A, MOT2 A', MOT2 B, MOT B' for supplying phase A and phase B power to connecting pads 442, 446 and terminals 412, 416 of MOTOR 2 are arranged adjacent to the pair GEN B, GEN B' at the apex of the triangular arrangement for the centrally located main power source. As shown in the exemplary embodiment of FIG. 4, each pair of power semiconductors that supplies power for a phase of a motor or a generator may be connected to a driver board 14 that is located between the pair of power semiconductors and a heat sink 12 connected to the pair of power semiconductors for dissipation of heat produced by the pair. In this embodiment, a heat sink 12 for dissipating thermal energy from one pair of power semiconductors supplying power to a first phase of the motor or generator is located on one side of the pair of power semiconductors, while another heat sink 12 connected for thermal dissipation from an additional pair of power semiconductors supplying power to a different phase of the motor or generator may be located on an opposite side of the additional pair of power semiconductors. For example, the pair of power semiconductors MOT2 A, MOT2 A' are connected to a driver board 14 located on the top side of the pair MOT2 A, MOT2 A', and connected for thermal dissipation to a heat sink 12 located on the top side of the pair. The pair of power semiconductors MOT2 C, MOT2 C' are connected to another driver board 14 located on the bottom side of the pair MOT2 C, MOT2 C', and connected for thermal dissipation to another heat sink 12 located on the bottom side of the pair. As explained above, the partially overlapping and parallel arrangement of power semiconductors in the power inverter assembly of FIG. 4 improves power flow by minimizing the distance between power stage phases, provides a compact electrical arrangement that minimizes parasitic bus bar inductance, minimizes inverter volume, minimizes heatsink length and temperature gradients throughout the power inverter, and maintains all of these benefits even with the power semiconductors arranged in parallel for higher power applications.

Figure 6:
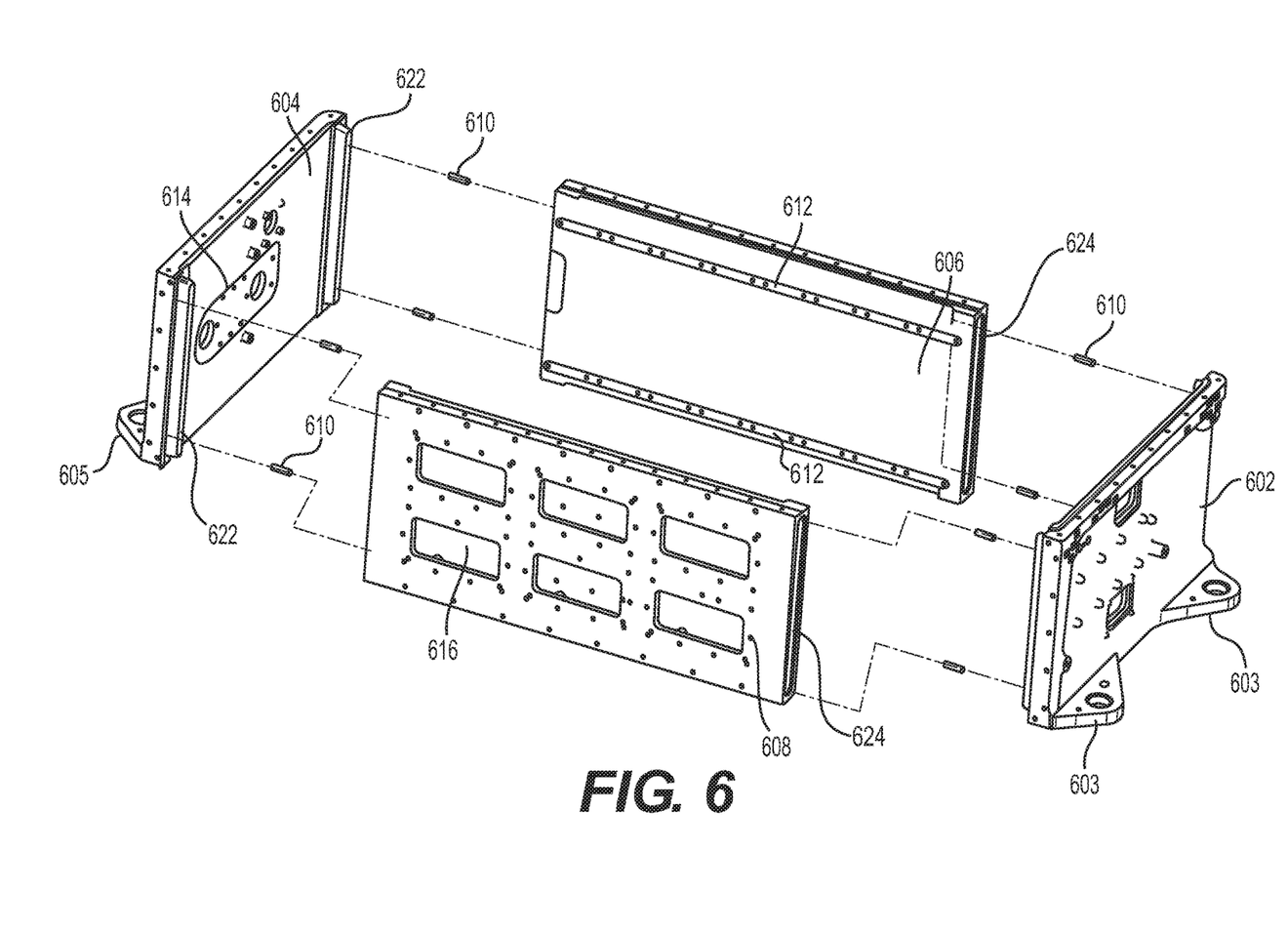
FIG. 6 is an exploded perspective view of an exemplary protective enclosure for a power inverter assembly according to the present disclosure.

A protective enclosure or housing for a power inverter assembly according to various embodiments of this disclosure is shown in FIG. 6. In exemplary applications where the power inverter assembly is converting large amounts of power (e.g., ¼ megawatt or more) for use by heavy machinery, large off-road vehicles, mining equipment, power generating plants, and other applications, the protective enclosure may be as large or larger than approximately 1 meter in length, 1 meter in width and ½ meter in height. In these types of applications the enclosure is often also required to be ruggedized in order to be able to withstand harsh environments and protect the electronics that are mounted within the housing. The exemplary embodiment of a power inverter protective enclosure shown in FIG. 6 is manufactured by adhesively bonding separate cast aluminum (Al) wall sections into the finished enclosure. In various alternative embodiments, each of the separate wall sections may be formed by processes such as casting, stamping, machining, additive manufacturing (3D manufacturing), and/or other techniques. As shown in FIG. 6, the wall sections may include a right-hand wall section 602, a left-hand wall section 604, a rear wall section 606, and a front wall section 608. The individual wall sections may be formed by casting from aluminum (Al) or other materials or alloys of various materials with good shock-absorbing characteristics, sufficient strength, manufacturability, and other desirable characteristics and features. Structural adhesives specially formulated for bonding the separate wall sections together are also provided with desirable strength, ease of application, desirable curing characteristics, and excellent durability characteristics. Various categories of structural adhesives may be used for bonding together the separate wall sections in variations and alternatives that may include epoxies, urethanes, acrylates, and room temperature vulcanized (RTV) silicones or other silicones. The structural adhesive used at the interfaces between the individual wall sections also helps to reduce the risk of air leakage through welds that commonly occurs in weldments. The use of structural adhesives for bonding together cast aluminum wall sections is also less expensive, and presents fewer manufacturability and quality challenges than welding aluminum.

Manufacturing costs can be a significant factor in the production of protective enclosures or housings for power inverter assemblies used on large off-road trucks, mining equipment and other machinery with large power requirements (e.g., greater than ¼ megawatt) and harsh working environments (e.g., large fluctuations and extremes in temperature and humidity, large loads, vibrations and shocks during operation of the machinery, and exposure to dust and dirt). These costs are significantly reduced by forming (e.g., casting) the individual wall sections and then bonding together the wall sections as shown in FIG. 6, as opposed to forming the protective enclosure as a monolithic casting, or as a weldment with flat panel metal sheets welded to a skeleton frame. Casting of the individual wall sections enables the incorporation of many different design features into the protective enclosure at lower costs and higher precision than would be the case with weldments. Additional advantages achieved by manufacturing the power inverter protective enclosure according to the techniques of the present disclosure include the ability to machine structural features and mounting features into the inside and outside surfaces of each of the separate wall sections as needed for special requirements of any particular power inverter assembly. In the exemplary embodiment of FIG. 6, protruding tongue portions 622 are formed along opposite end edges of the right-hand and left-hand wall sections 604, 602. The tongue portions are configured to mate with corresponding blind grooves 624 formed into opposite end edges of the front and rear wall sections 608, 606. In some implementations the tongue portions may include tapered side surfaces and edge chamfers, which assist with alignment and positioning of the wall sections relative to each other as the tongue portions are inserted into the blind grooves. Pins 610 may also be provided at spaced intervals along the edges of the side walls and/or front and rear walls, and may be press fit into holes drilled into the tongue portions and at the bottom of the blind grooves. The tongue and groove features and pins assist with proper alignment and positioning of the wall sections during the assembly and bonding process. Additional features may be formed in or on the wall sections, such as during the casting process, or machined into inside or outside surfaces of the wall sections after the wall sections are formed and before they are joined together. These mounting features may include mounting rails 612 extending along inner faces of the front and rear wall sections, mounting recesses 614 configured for supporting heat sinks, driver boards, or other electronic components, protruding bosses or mounting flanges 603, 605 formed along the side walls or front and rear walls, pockets 616 formed on one or more outer surfaces of the wall sections, ports defined through one or more wall sections, etc. Some additional advantages of forming the separate wall sections before assembling the individual wall sections into a completed protective enclosure or housing for the power inverter assembly include the ability to machine features such as the blind grooves 624 with precision on all sides with simple fixtures, and up close to the ends of the wall sections, thereby allowing for a reduction in the overall size of the protective enclosure. Additional advantages include the ability to precisely position the various electronic components, heat sinks, and driver boards in the enclosure, provide strong support of all of the components while maintaining a completely sealed environment within the finished enclosure.

A protective housing for a power inverter assembly, such as shown in FIG. 6, may also enclose a DC connection compartment, an AC connection compartment, terminal blocks and connection pads, controls connectors, accessory connectors, capacitors, batteries, inductors, and other electronic devices, cooling features, and electrical connectors. The AC connection compartment provides access for AC power connection from outside the housing to the components inside the housing, and the DC connection compartment provides access for DC power connection from outside the housing to components inside the housing. Various connectors may be lug-and-gland type connectors from AC or DC cables to one or more terminal blocks. One or more heat sinks, such as heat sinks 12 shown in FIG. 4, may be bolted to the housing along inside surfaces of any of the wall sections. The heat sinks may be machined flat and may include power semiconductor module mounting holes for mounting a plurality of power semiconductor modules. Coolant passages are provided that route coolant such as glycol or water through the heat sinks to remove heat generated by the power semiconductor modules. The heat sinks and the housing may be configured such that the heat sinks can be mounted with the coolant inlet/outlet connections on any side of the housing. The housing may include housing apertures either machined or formed in one or more side wall sections, which are added to accommodate coolant inlet/outlet connections. Heat sink mounting holes for attaching the heat sinks to the housing may be arranged in symmetry about a left-right axis or a front-back axis in order to allow the heat sinks to be attached to the housing in different orientations. In this way, the power inverter housing can provide coolant inlet/outlet connections on any side while using the same housing and heat sinks. The power semiconductor module mounting holes that attach the power semiconductor modules to the heat sinks may also be configured with a symmetry about either the left-right axis or the front-back axis of the power inverter assembly, allowing proper mounting of the power semiconductor modules in various mounting configurations.

The power semiconductor modules typically include paired silicon-based insulated gate bipolar transistors (IGBTs) and fly-back diodes. The IGBTs are enclosed in a case and electrically connected to connection terminals. Connection terminals are also included for connection of the IGBT gates to the driver boards 14. A backing plate may also be thermally connected to the IGBTs and diodes. Heat generated by the IGBTs during switching is conducted through the backing plate and into the heat sink where it can be removed by circulating coolant. Mounting holes are provided for mounting the power semiconductor modules to the heat sinks 12.

The power inverter assemblies and housing according to various exemplary embodiments of this disclosure are designed to work with either induction/permanent magnet (PM) or switched reluctance (SR) technology. Induction/PM and SR technology require power semiconductor modules with different configurations. An induction/PM power module is configured with both IGBTs in series. Three induction/PM power modules in a power module set are typically used to provide three-phase AC that connects to a stator winding of an induction/PM machine such as a motor or generator. An SR power semiconductor module is configured with both IGBTs in parallel and provides power for one stator winding of an SR machine such as a motor or generator. SR power semiconductor modules in a set of power modules can be combined to provide AC power to multi-phase SR machines.

Though possible, it is inefficient from a space and cost perspective to use an induction/PM configuration to power an SR machine. As such, power inverters are not typically designed to accommodate both induction/PM and SR technology. A power inverter package that can accommodate both induction/PM and SR technology would require a power semiconductor module that is available in both induction/PM and SR configurations. In such an implementation, the induction/PM power module and SR power module may have identical mounting and DC connection configurations, and may therefore be mechanically interchangeable with the exception of the start/finish or AC connections. As shown in FIG. 5, an AC laminated bus bar structure for a SR power inverter may be provided at each of the driver boards 14 for connecting two IGBT SR modules in parallel and then to common connection points (typically referred to as "START" and "FINISH"). In various alternative implementations, more than two power semiconductor modules may also be connected together in parallel.

FIG. 5 illustrates an exemplary arrangement of a pair of SR IGBT modules A, A' connected together in parallel on the output or AC side of the modules. A broad flat plate connector 520 of an AC laminated bus bar structure may include a L-shaped flat plate portion 522, and extend across a pair of power semiconductors (IGBTs) 521, 521', connecting the pair of IGBTs to a common START connection point on the AC output side of the SR IGBT modules A, A'. Another broad flat plate connector 524 may include a L-shaped flat plate protruding portion 526, and extend across a pair of power semiconductors (IGBTs) 525, 525', connecting the pair of IGBTs to a common FINISH connection point on the AC output side of the SR IGBT modules A, A'.

Some potential reasons for using a laminated bus bar on the DC input side of the pairs of power semiconductors include attempting to protect the semiconductors (e.g., IGBTs) from a voltage overshoot during turn off by providing a low inductance path between the semiconductors and filter capacitors that absorb the energy that drives the voltage overshoot. These issues are not of concern on the AC output side of the SR IGBT modules. Typically, the AC output side of the pairs of power semiconductors uses point to point monolithic bus bars (thicker narrow copper bars). However, the broad flat plate connectors of the AC laminated bus bar structure according to various embodiments of this disclosure enable paralleling of the output of two semiconductor modules so the modules most effectively share the current. The laminated bus bar structure according to this disclosure facilitates this well balanced electrical power sharing between power semiconductors at reduced costs and ease of manufacturing in comparison to conventional point to point monolithic bus bars. The laminated structure naturally helps with the current sharing while providing added thermal capacitance, improved cooling or thermal dissipation, lower parasitic inductance effects, and reduced electromagnetic emissions.

In various implementations of this disclosure, the broad flat plate connectors may be formed from pure copper sheets. The broad flat plate connectors connecting the AC output sides of the IGBTs in a pair of IGBT modules to the common START and FINISH connection points are arranged in a partially overlapping relationship, with an insulating coating such as the stretched polyester film sold under the trademark MYLAR™ covering the overlapping portions of the connectors. The broad flat plate connectors are also designed such that they impose electrical impedances to the AC current flowing between the AC output sides of the pairs of IGBT modules and the common connection points START and FINISH that are nearly equivalent within acceptable manufacturing tolerances (e.g., approximately within ±10% of each other). The electrical impedances of the broad flat plate connectors are a measure of the opposition the connectors present to an AC current when a driving voltage is applied across the connectors. The broad flat plate design of the connectors according to various implementations of this disclosure ensures that each of the IGBT modules carries approximately the same electrical power. This balancing of the amount of electrical power flowing through the IGBT modules, in combination with the low inductance electrical paths that result from the flat plate connectors being situated physically very close to each other results in improved performance and durability of the IGBT modules over modules provided with conventional fabricated bus bars or wired interconnections.

The broad flat plate laminated bus bar structure also improves the thermal dissipation of the IGBT electrical connections as a result of the large radiating surface area. Additionally, this structure provides a high degree of alignment verification for the power semiconductors connected in parallel, ensuring that each power semiconductor module is carrying the same or very nearly the same electrical power. The well balanced distribution of electrical power ensures that the power inverter assembly will last longer and have better durability than would be the case if some of the interconnected IGBTs were receiving or producing more electrical power than others. The well balanced structure with broad flat plate electrical paths interconnecting the IGBTs also results in low moments of inertia for applications with high vibration levels, and lower inductance electrical connections between the IGBTs than is the case with conventional fabricated bus bar structures or wired interconnections.

INDUSTRIAL APPLICABILITY

The various exemplary power inverter assemblies, broad flat plate connectors, and protective enclosure of the present disclosure are designed to be adapted to a large number of configurations applicable in situations with high power requirements, and benefiting from the ability of the enclosure to protect the enclosed electronics in harsh environments and under harsh operating conditions. Industrial applications for the disclosed power inverter assemblies and protective enclosure include large off-road machinery such as wheel loaders, heavy mining machines, and power generating plants. The disclosed implementations of manufacturing methods for producing the protective enclosure to house a power inverter assembly result in a significantly reduced cost enclosure in comparison to conventional methods of casting a monolithic structure for the enclosure. The disclosed method of casting or otherwise forming individual aluminum wall sections, which may then be machined with desired mounting features or other physical characteristics and bonded together using structural adhesives to form a finished enclosure, provides advantages in addition to the reduced costs. These advantages include improved manufacturability, a more compact enclosure, and flexibility in the placement of various features such as supports for heat sinks, gate driver boards, and electronic components.

The disclosed arrangements of IGBT modules in relationship to heat sinks and driver boards supported within the protective enclosure provide power inverter designs that improve electrical power flow through the power inverter assembly by minimizing the distance between the power stage phases and allowing for the placement of a main power source centrally in the design. The disclosed arrangements provide a more compact assembly of power semiconductors than linear arrangements, and therefore reduced power inverter volume, a reduced length of heatsink, reduced temperature gradients, reduced parasitic bus bar inductance, and improved balancing of the amount of electrical power carried by each of the power semiconductors.

The disclosed AC laminated bus bar structure with broad flat plate connectors interconnecting the AC outputs of pairs of IGBT modules for each phase of multi-phase electrical machines also provides many advantages over conventional fabricated bus bar structures or wired interconnections between the IGBTs in a power inverter. These advantages include improved thermal dissipation from the electrical connections between the IGBTs resulting from the large radiating surface areas of the flat plate connectors, lower inductance connections between the paralleled IGBT modules as a result of the close physical proximity of the flat plate connectors, a high degree of alignment verification for the paralleled power semiconductors, and lower moments of inertia for high vibration applications of the power inverters.

It will be apparent to those skilled in the art that various modifications and variations can be made to the power inverter assembly and protective enclosure of the present disclosure. Other embodiments will be apparent to those skilled in the art from consideration of the specification and practice of the disclosed power inverter assembly and methods of manufacturing a protective enclosure for the disclosed power inverter assembly. It is intended that the specification and examples be considered as exemplary only, with a true scope being indicated by the following claims and their equivalents.

What is claimed is:

1. A power inverter assembly configured to provide a balanced power flow to each of a plurality of electrical machines, the power inverter assembly comprising:
   at least one heat sink having a top side and a bottom side;
   a plurality of pairs of power semiconductor modules mounted along the top and bottom sides of at least one of the at least one heat sink for thermal exchange with the at least one heat sink; and
   a plurality of gate driver boards configured to control a supply of direct current (DC) power to each of the plurality of pairs of power semiconductor modules;
   each pair of power semiconductor modules being configured to switch DC electrical power on and off to one phase of one of a three phase alternating current (AC) electrical motor or a three phase AC electrical generator of the plurality of electrical machines,
   a first pair of the plurality of pairs of power semiconductor modules being configured to supply electrical power to a first phase of a first one of a three phase AC electrical motor or generator, the first pair being located on and connected to one of a top side or a bottom side of one of the at least one heat sink for thermal exchange therewith,
   second and third pairs of the plurality of pairs of power semiconductor modules being configured to supply electrical power to second and third phases, respectively, of the first three phase AC electrical motor or generator, the second and third pairs being located on and connected to the other of a top side or a bottom side of one of the at least one heat sink for thermal exchange therewith,
   the first pair being symmetrically arranged relative to the second and third pairs such that the arrangement of the first, second, and third pairs of power semiconductor modules forms a geometric pattern with at least one of the second and third pairs at least partially overhanging the first pair,
   a fourth pair of the plurality of pairs of power semiconductor modules being configured to supply electrical power to a first phase of a second one of a three phase AC electrical motor or generator, the fourth pair being located on an opposite side of a heat sink from the first pair;
   fifth and sixth pairs of the plurality of pairs of power semiconductor modules being configured to supply electrical power to second and third phases, respectively, of the second one of the three phase AC electrical motor or generator, the fifth and sixth pairs being located on an opposite side of a heat sink from the fourth pair, and the fourth pair being symmetrically arranged relative to the fifth and sixth pairs such that the arrangement of the fourth, fifth, and sixth pairs of power semiconductor modules forms a geometric pattern with at least one of the fifth and sixth pairs at least partially overhanging the fourth pair, and with at least a portion of the pairs of power semiconductor modules that supply electrical power to the second one of the three phase AC electrical motor or generator overlapping relative to a portion of the pairs of power semiconductor modules that supply electrical power to the first one of the three phase AC electrical motor or generator.

2. The power inverter assembly of claim 1, wherein AC outputs of each pair of power semiconductor modules are connected together and to a common start connection point and a common finish connection point in parallel by broad flat plate connectors designed to each have an electrical impedance that is approximately within ±10% of each other.

3. The power inverter assembly of claim 1, further including a third one of a three phase AC electrical motor or generator of the plurality of electrical machines,
a seventh pair of the plurality of pairs of power semiconductor modules being configured to supply electrical power to a first phase of the third one of the three phase AC electrical motor or generator, the seventh pair being located on an opposite side of a heat sink from the fourth pair;
eighth and ninth pairs of the plurality of pairs of power semiconductor modules being configured to supply electrical power to second and third phases, respectively, of the third one of the three phase AC electrical motor or generator, the eighth and ninth pairs being located on an opposite side of a heat sink from the seventh pair, and
the seventh pair being symmetrically arranged relative to the eighth and ninth pairs such that the arrangement of the seventh, eighth, and ninth pairs of power semiconductor modules forms an isosceles triangle-shaped pattern, with the base of the triangle formed by the eighth and ninth pairs, and the apex of the triangle formed by the seventh pair, and with at least a portion of the pairs of power semiconductor modules that supply electrical power to the third one of the three phase AC electrical motor or generator overlapping relative to a portion of the pairs of power semiconductor modules that supply electrical power to the second one of the three phase AC electrical motor or generator.

4. The power inverter assembly of claim 1, wherein AC outputs of each pair of power semiconductor modules are connected together and to a common start connection point and a common finish connection point in parallel by broad flat plate connectors designed to each have an electrical impedance that is approximately within ±10% of each other.

5. The power inverter assembly of claim 3, wherein AC outputs of each pair of power semiconductor modules are connected together and to a common start connection point and a common finish connection point in parallel by broad flat plate connectors designed to each have an electrical impedance that is approximately within ±10% of each other.

6. The power inverter assembly of claim 1, wherein each of the plurality of pairs of semiconductor modules includes at least one insulated gate bipolar transistor (IGBT).

7. The power inverter assembly of claim 1, wherein each of the plurality of gate driver boards is located on an opposite side of one of the plurality of pairs of semiconductor modules from the heat sink.

8. The power inverter assembly of claim 1, wherein each of the plurality of gate driver boards is located on the same side of one of the plurality of pairs of semiconductor modules as the heat sink.

9. A power inverter assembly configured to provide a balanced power flow to each of a plurality of electrical machines, the power inverter assembly comprising:
at least one heat sink having a top side and a bottom side;
a plurality of pairs of power semiconductor modules mounted along the top and bottom sides of at least one of the at least one heat sink for thermal exchange with the at least one heat sink; and
a plurality of gate driver boards configured to control a supply of direct current (DC) power to each of the plurality of pairs of power semiconductor modules;
each pair of power semiconductor modules being configured to switch DC electrical power on and off to one phase of one of a three phase alternating current (AC) electrical motor or a three phase AC electrical generator of the plurality of electrical machines,
a first pair of the plurality of pairs of power semiconductor modules being configured to supply electrical power to a first phase of a first one of a three phase AC electrical motor or generator, the first pair being located on and connected to one of a top side or a bottom side of one of the at least one heat sink for thermal exchange therewith,
second and third pairs of the plurality of pairs of power semiconductor modules being configured to supply electrical power to second and third phases, respectively, of the first three phase AC electrical motor or generator, the second and third pairs being located on and connected to the other of a top side or a bottom side of one of the at least one heat sink for thermal exchange therewith,
the first pair being asymmetrically arranged relative to the second and third pairs such that the arrangement of the first, second, and third pairs of power semiconductor modules forms a geometric pattern with at least one of the second and third pairs at least partially overhanging the first pair,
a fourth pair of the plurality of pairs of power semiconductor modules being configured to supply electrical power to a first phase of a second one of a three phase AC electrical motor or generator, the fourth pair being located on an opposite side of a heat sink from the first pair;
fifth and sixth pairs of the plurality of pairs of power semiconductor modules being configured to supply electrical power to second and third phases, respectively, of the second one of the three phase AC electrical motor or generator, the fifth and sixth pairs being located on an opposite side of a heat sink from the fourth pair, and
the fourth pair being asymmetrically arranged relative to the fifth and sixth pairs such that the arrangement of the fourth, fifth, and sixth pairs of power semiconductor modules forms a L-shaped pattern, with the fourth pair defining a short leg of the L-shaped pattern and the fifth and sixth pairs defining a long leg of the L-shaped pattern, and with at least a portion of the pairs of power semiconductor modules that supply electrical power to the second one of the three phase AC electrical motor or generator overlapping relative to a portion of the pairs of power semiconductor modules that supply electrical power to the first one of the three phase AC electrical motor or generator.

10. The power inverter assembly of claim 9, wherein AC outputs of each pair of power semiconductor modules are connected together and to a common start connection point and a common finish connection point in parallel by broad flat plate connectors designed to each have an electrical impedance that is approximately within ±10% of each other.

11. The power inverter assembly of claim 9, further including a third one of a three phase AC electrical motor or generator of the plurality of electrical machines,
   a seventh pair of the plurality of pairs of power semiconductor modules being configured to supply electrical power to a first phase of the third one of the three phase AC electrical motor or generator, the seventh pair being located on an opposite side of a heat sink from the fourth pair;
   eighth and ninth pairs of the plurality of pairs of power semiconductor modules being configured to supply electrical power to second and third phases, respectively, of the third one of the three phase AC electrical motor or generator, the eighth and ninth pairs being located on an opposite side of a heat sink from the seventh pair, and
   the seventh pair being asymmetrically arranged relative to the eighth and ninth pairs such that the arrangement of the seventh, eighth, and ninth pairs of power semiconductor modules forms a L-shaped pattern, with the seventh pair defining a short leg of the L-shaped pattern and the eighth and ninth pairs defining a long leg of the L-shaped pattern, and with at least a portion of the pairs of power semiconductor modules that supply electrical power to the third one of the three phase AC electrical motor or generator overlapping relative to a portion of the pairs of power semiconductor modules that supply electrical power to the second one of the three phase AC electrical motor or generator.

12. The power inverter assembly of claim 9, wherein AC outputs of each pair of power semiconductor modules are connected together and to a common start connection point and a common finish connection point in parallel by broad flat plate connectors designed to each have an electrical impedance that is approximately within ±10% of each other.

13. The power inverter assembly of claim 11, wherein AC outputs of each pair of power semiconductor modules are connected together and to a common start connection point and a common finish connection point in parallel by broad flat plate connectors designed to each have an electrical impedance that is approximately within ±10% of each other.

14. The power inverter assembly of claim 9, wherein each of the plurality of pairs of semiconductor modules includes at least one insulated gate bipolar transistor (IGBT).

15. The power inverter assembly of claim 9, wherein each of the plurality of gate driver boards is located on an opposite side of one of the plurality of pairs of semiconductor modules from the heat sink.

16. The power inverter assembly of claim 9, wherein each of the plurality of gate driver boards is located on the same side of one of the plurality of pairs of semiconductor modules as the heat sink.

17. A method of manufacturing a protective enclosure for housing the power inverter assembly of claim 1, the method comprising:
   forming each of four independent walls for the protective enclosure, wherein each of the four walls includes at least one of structural features and mounting features,
      the structural features assisting in the alignment, positioning and joining of the four independent walls together into the protective enclosure,
      the mounting features at least one of supporting and positioning at least one of a heat sink, a circuit board, and an electronic component; and
   bonding the four independent walls together using a structural adhesive.

18. The method of claim 17, wherein each of the four independent walls is cast aluminum, and wherein the structural features are machined into the walls before bonding the wall together, the structural features including tongue portions and blind groove portions on respective walls that are joined together before bonding.

* * * * *